United States Patent [19]

Wilson

[11] 4,072,871

[45] Feb. 7, 1978

[54] ELECTROACOUSTIC TRANSDUCER

[75] Inventor: Charles R. Wilson, Glen Burnie, Md.

[73] Assignee: Westinghouse Electric Corporation, Pittsburgh, Pa.

[21] Appl. No.: 471,922

[22] Filed: May 20, 1974

[51] Int. Cl.² .............. H01L 41/04

[52] U.S. Cl. .............. 310/333; 340/10

[58] Field of Search .............. 310/8.2, 8.3, 8.4, 8.5, 310/8.6, 8.7, 9.1, 9.4, 9.5; 340/10

[56] References Cited

U.S. PATENT DOCUMENTS

| | | | |
|---|---|---|---|
| 2,962,695 | 11/1960 | Harris | 310/8.7 |
| 3,104,334 | 9/1963 | Bradley, Jr. et al. | 310/8.4 |
| 3,583,677 | 6/1971 | Phillips | 310/8.6 X |
| 3,727,084 | 4/1973 | Epstein | 310/8.4 |
| 3,739,202 | 6/1973 | Cady | 310/8.4 X |

*Primary Examiner*—Mark O. Budd

*Attorney, Agent, or Firm*—D. Schron

[57] ABSTRACT

A transducer for transmitting and/or receiving acoustic energy under water includes a head mass, a tail mass, and an active motor/generator section which includes piezoelectric elements active in the shear mode of operation. Another embodiment illustrates a transducer of a bender configuration.

5 Claims, 8 Drawing Figures

FIG.1
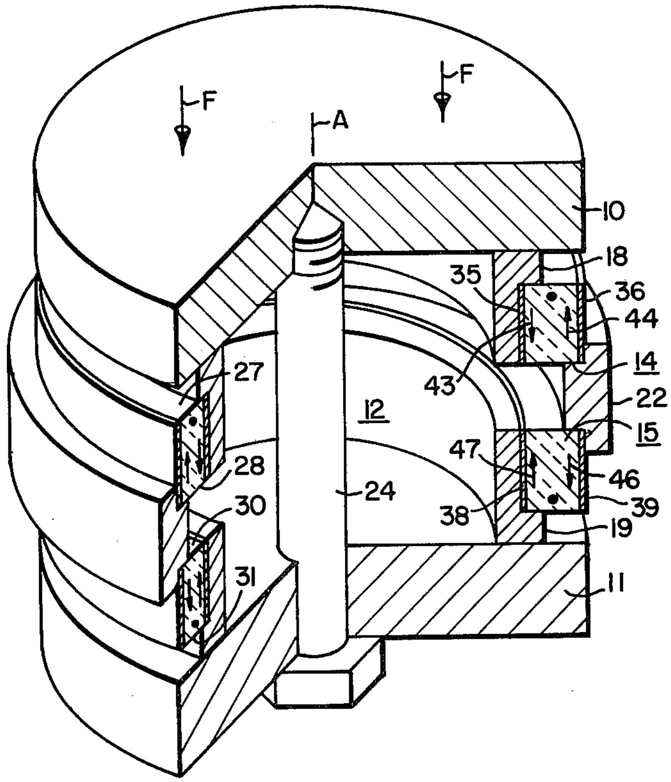
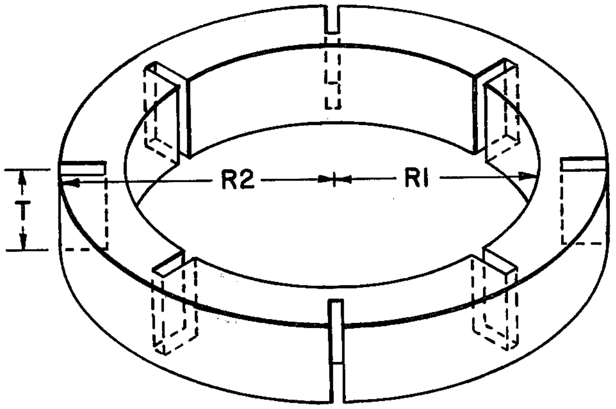
FIG.2A
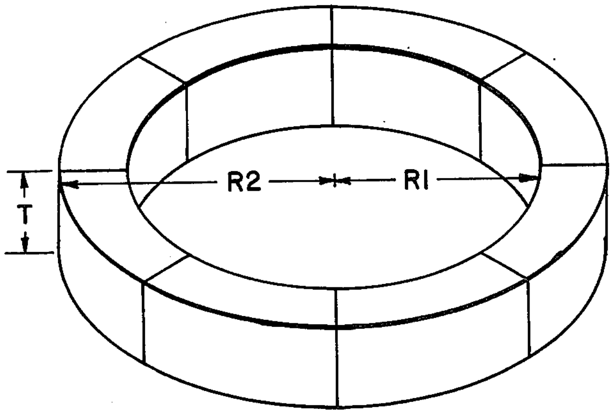
FIG.2B

FIG.5
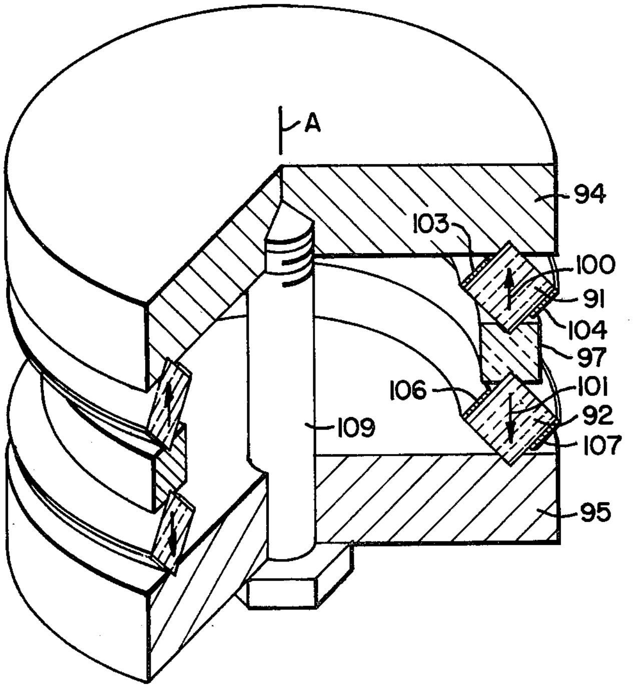
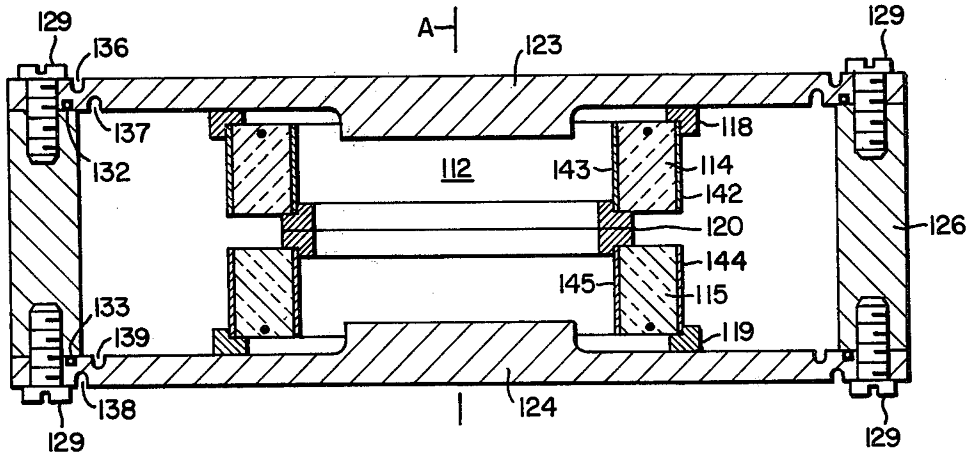
FIG.6

ELECTROACOUSTIC TRANSDUCER

BACKGROUND OF THE INVENTION

1. Field of the Invention

This invention in general relates to transducers and more particularly to low frequency underwater transducers.

2. Description of the Prior Art

A common type of transducer used for underwater detection is the Tonpilz or longitudinal resonator type which has a head mass, a tail mass, and an active material operational in the compressional mode. With detection systems operating at lower and lower resonant frequencies, the requirements for a resonant transducer element becomes more difficult from a point of view of weight, size and volume, especially when a large array of transducers is utilized in the detection system. Any reduction of size and weight, without sacrificing low frequency operation, would be most desirable, and the present invention provides just such a transducer.

SUMMARY OF THE INVENTION

The transducer of the present invention provides low frequency operation with an attendant reduction in size and weight coupled with production of high acoustic power per unit weight and volume. It accomplishes this by the provision of an active section which includes a piezoelectric oscillatory material which is operated and is active in the shear mode of operation. In a typical construction, the transducer would have a head mass, a tail mass, with the active section coupled to and supported between the head and tail masses.

BRIEF DESCRIPTION OF THE DRAWINGS

FIG. 1 illustrates an isometric view with a portion broken away, a preferred embodiment of the present invention;

FIGS. 2A and 2B illustrate piezoelectric oscillatory elements which may be utilized in the transducers;

FIG. 5 illustrates an isometric view with a portion broken away, another embodiment of the present invention for providing increased output; and FIGS. 6 and 7 illustrate another type of transducer incorporating the principles of the present invention.

DESCRIPTION OF THE PREFERRED EMBODIMENT

Figure 3:
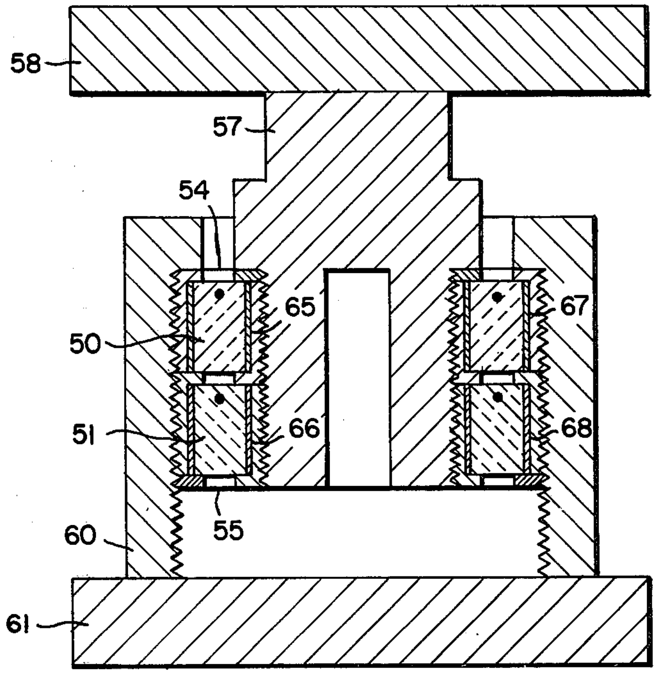
FIG. 3 illustrates in diametrical cross section, another embodiment of the present invention.

FIG. 1 illustrates a Tonpilz type transducer in that it includes a head mass 10, tail mass 11, and an active section 12 which is the motor and/or generator section of the transducer. In the present invention, the active section 12 includes an active oscillatory material such as a piezoelectric which is operated in the shear mode, as opposed to conventional Tonpilz transducers which include a plurality of stacked ceramic piezoelectric rings operating in the compression and/or tension mode.

The active section 12 includes a piezoelectric element 14 in the form of a ring having inner, outer and end planar surfaces of surrounding the central, or longitudinal axis A of the transducer. In general, the higher the compliance of the active section, the lower will be the operating resonant frequency. Normally, more than one piezoelectric element will be needed to get the required high compliance and accordingly a second similar piezoelectric element 15 is included.

Support means are included so that the piezoelectric elements are coupled to and supported between the head and tail masses 10 and 11. The support means includes a first support member 18 connected to the head mass 10 and a second and similar support member 19 connected to the tail mass 11. The piezoelectric elements 14 and 15 nest within respective shoulder portions of support members 18 and 19 and are maintained in spaced relationship by means of a third or outer support member 22.

In order that the piezoelectric elements 14 and 15 be less fragile during installation, a stress bolt 24 is provided to perform the similar function of stressing, as in the case of a compression and/or tension mode.

The compliance provided by the active section 12 depends not only upon the dimensions of the piezoelectric elements but also upon the material from which they are made. In the preferred embodiment, the elements will be made of a ceramic material such as barium titanate or lead zirconate titanate (PZT) poled with a high DC bias in their manufacture so that they operate as a piezoelectric type material and exhibit a linear voltage-displacement relationship.

In the arrangement of FIG. 1, the elements 14 and 15 have been poled as indicated by the respective dots by means of electrodes which were originally placed upon surfaces 27 and 28 for element 14, and 30 and 31 for element 15. After the poling operation, the electrodes were subsequently removed from those surfaces and electrodes for operation were deposited on surfaces perpendicular thereto. These operational electrodes are illustrated as inner and outer electrodes 35 and 36 for element 14 and inner and outer electrodes 38 and 39 for element 15. Suitable electrical connections (not shown) are made to the respective electrodes so that the voltages produced in operation, will add.

In the supporting arrangement, it is seen that inner electrodes 35 and 38 contact respective support members 18 and 19 while the outer electrodes 36 and 39 contact the support member 22. With such an arrangement, these support members should be made of an electrically non-conducting material, carborundum being one example, to eliminate the requirement for insulation.

Since the piezoelectric elements have been fabricated for operation in the shear mode, they must also be supported for operation in the shear mode and the typical forces involved will now be examined. Considering operation for example, as a receiver of acoustic energy, a force on the head mass 10 must be transmitted to the active elements to produce a corresponding voltage indicative of the force. The force involved is not the static pressure force, but the force due to the acoustic signal at a certain point in time. The force on the head mass 10 is represented by the arrows F. This force is transmitted through the first support member 18 to the piezoelectric element 14 such that the inner portion thereof moves downwardly in the direction of arrow 43 while the outer portion thereof moves upwardly in the direction of arrow 44. The force is coupled through the third support member 22 to the piezoelectric element 15 such that its outer portion moves downwardly in the direction of arrow 46 while its inner portion moves upwardly in the direction of arrow 47. These opposing moments in each piezoelectric element results in a net shearing, the horizontal component of which (for the orientation illustrated) results in the production of a proportional voltage at respective inner and outer electrodes.

Certain parameters exist for defining the piezoelectric oscillatory element and its operation. One such parameter is the coupling coefficient which defines the conversion of energy by the piezoelectric element from electrical to mechanical form and vice versa. The ideal element would have a coupling coefficient of one, however, in reality such is not the case. Shear mode operated piezoelectric elements can be fabricated having coupling coefficients at least equal to or greater than a same size piezoelectric element operating in the compressional mode. A typical coupling coefficient for a piezoelectric element operating in a shear mode ($k_{15}$) or one operating in the compressional mode ($k_{33}$) would be in the order of 0.70.

There are two piezoelectric coefficients associated with the element, the piezoelectric charge coefficient which is the ratio of the electric charge generated per unit area to the force applied per unit area, and the piezoelectric voltage coefficient which is the ratio of the electric field produced to the applied mechanical stress. The piezoelectric element operated in the shear mode exhibits higher values for both of these coefficients than a similar element operated in a compressional mode. For example, a typical value for the piezoelectric charge coefficient in the shear mode ($d_{15}$) would be 495 $\times 10^{-12}$ mks unit as compared to a lower value of 285 $\times 10^{-12}$ mks units for the compressional mode piezoelectric coefficient ($d_{33}$). For the same unit, the shear mode piezoelectric voltage coefficient ($g_{15}$) would be 38 $\times 10^{2}$ mks units as compared to a coefficient for the compressional mode ($g_{33}$) of 24.9 $\times 10^{2}$ mks units.

Another parameter associated with the piezoelectric element is the ratio of the force per unit area to the change in length per unit length, this ratio being termed its Young's modulus. Basically, for a lower resonant frequency, a higher compliance of the active section is desired. Young's modulus is inversely related to compliance and therefore the lower the value for Young's modulus the higher the compliance will be. For the same size elements being compared, typical values might be for the shear mode ($Y_{55}E$) 2.6 $\times 10^{-10}$ mks units compared to the compressional mode ($Y_{33}E$) value of 6.6 $\times 10^{-10}$ mks units. This relatively low figure for the shear mode operation compared to the compressional mode results in a unit that is about 20% smaller in size and weight for operation at the same low frequency. For the same applied force, the transducer configured in accordance with the present invention will provide an output voltage which is more than 1½ times that of a conventional Tonpilz transducer.

The compliance $C_M$ of a piezoelectric cylindrical element in shear may be given by the equation:

$$C_M = \frac{\ln\left(\frac{R_1}{R_2}\right)}{2\pi T U_{55}E}$$

where $R_1$ and $R_2$ are the inner and outer radii of the element $T$ is the thickness of the element $U_{55}E$ is the shear modulus in Newtons per square meter.

The compliance of this piezoelectric element is greatly dependent upon the ratio of the radii and it is recommended that if such a configuration is used, the ratio of $R_2$ to $R_1$ be made as large as practical and to aid in increasing the overall compliance of the element, it may be slotted as illustrated in FIG. 2A or made in independent sections as illustrated in FIG. 2B.

The piezoelectric elements may be arranged in various electrical and mechanical series, parallel or series parallel combinations. For example, FIG. 3 illustrates a transducer having piezoelectric elements 50 and 51 mechanically supported in a parallel configuration. In the arrangement of FIG. 3, the piezoelectric elements 50 and 51 may be arranged in electrically conducting inserts 54 and 55 which are threadably engaged with a first support member 57 connected to head mass 58, and a second support member 60 connected to tail mass 61. Since no stress bolt is used, although if desired one could be used, the first and second support members 57 and 60 are secured to their respective masses by means of epoxy glue, for example.

The piezoelectric elements 50 and 51 are relatively poled as indicated by the dots and electrodes 65 and 66 provided for respective inner surfaces and electrodes 67 and 68 provided for respective outer surfaces.

Figure 4:
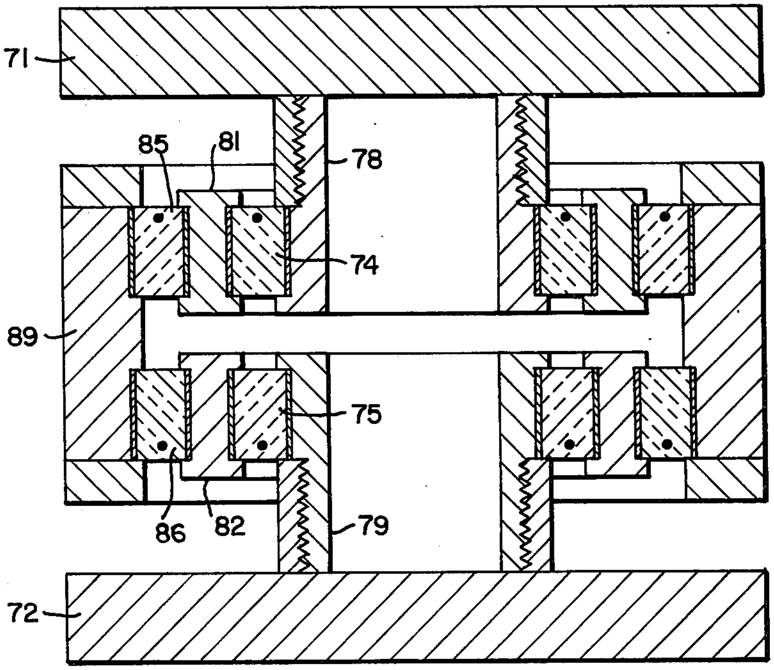
FIG. 4 illustrates in diametrical cross section another embodiment of the present invention.

FIG. 4 illustrates a transducer arrangement wherein the piezoelectric elements operating in the shear mode are supported in a series-parallel configuration between head and tail masses 71 and 72. The two inner piezoelectric elements 74 and 74, suitably electroded and poled as indicated by the dots, are connected to respective support members 78 and 79 at their inner surface and to support members 81 and 82 at their outer surfaces. Respective outer piezoelectric elements 85 and 86 concentric with elements 74 and 75 respectively, are poled as indicated by the dots and are held in position by support members 81 and 82, in addition to an outer support member 89, which, like all of the other support members should be made of an electrically non-conducting material, such as carborundum.

In the arrangements thus far illustrated, the piezoelectric elements were arranged in an orientation such that the sides of the elements were parallel or perpendicular to the longitudinal axis of the composite transducer. FIG. 5 illustrates a transducer arrangment wherein the piezoelectric elements are oriented such that the maximum shear displacement is parallel to the longitudinal axis A of the transducer to optimize the transforming of strain energy into acoustic energy in the direction along the axis of the transducer. The piezoelectric elements 91 and 92 are supported between head and tail masses 94 and 94 with the supporting arrangement including a common support member 97. The resultant shear components for elements 91 and 92 are illustrated by the arrows 100 and 101 both parallel to the axis A. The edges of the piezoelectric elements 91 and 92 fit into respective grooves in the head mass 94, tail mass 95 and support member 97. Electrodes are placed on the piezoelectric element so as not to contact the head or tail masses and are symmetrically disposed as illustrated by electrodes 103 and 104 for piezoelectric element 91 and electrodes 106 and 107 or piezoelectric element 92. The arrangement may be secured by a suitable bonding agent such as epoxy and a stress bolt 109 may be provided as previously discussed.

The principles of the present invention in utilizing a piezoelectric oscillatory element active in the shear mode of operation as the motor/generator section of a transducer also applies to other transducer configurations such as illustrated in FIG. 6.

FIG. 6 illustrates a transducer in what is termed a bender configuration. The transducer includes an active motor/generator section 112 which includes first and second piezoelectric rings 114 and 115 each active in the shear mode of operation, as previously described. Support members 118, 119, and 120 support the active section 112 between first and second bender disks 123 and 124. The disks 123 and 124 are secured to a cylindrical housing 126 such as by bolts 129. 0 ring seals 132 and 133 are provided to keep the ambient seawater from the interior of the unit, which may be air or a compliant fluid such as silicon oil.

Disk 123 is provided with grooves 136 and 137 so as to allow for increased axial movement during operation. Similarly disk 124 is provided with grooves 138 and 139 to allow for increased axial movement.

In operation, an AC signal applied to the active section 112 by way of electrodes 142 and 145, causes shear mode activation of piezoelectric elements 114 and 115 to in turn cause the bender disks 123 and 124 to move in opposite directions along the axis A. Conversely, acoustic signals within the range of operation of the transducer will cause a corresponding output signal indicative of such signals.

The bender configuration illustrated in FIG. 6 in conjunction with shear mode operation of the active section results in an extremely low frequency of operation, even lower than the Tonpilz transducer previously described, with the beam of pattern of such transducer being essentially omnidirectional.

Figure 7:
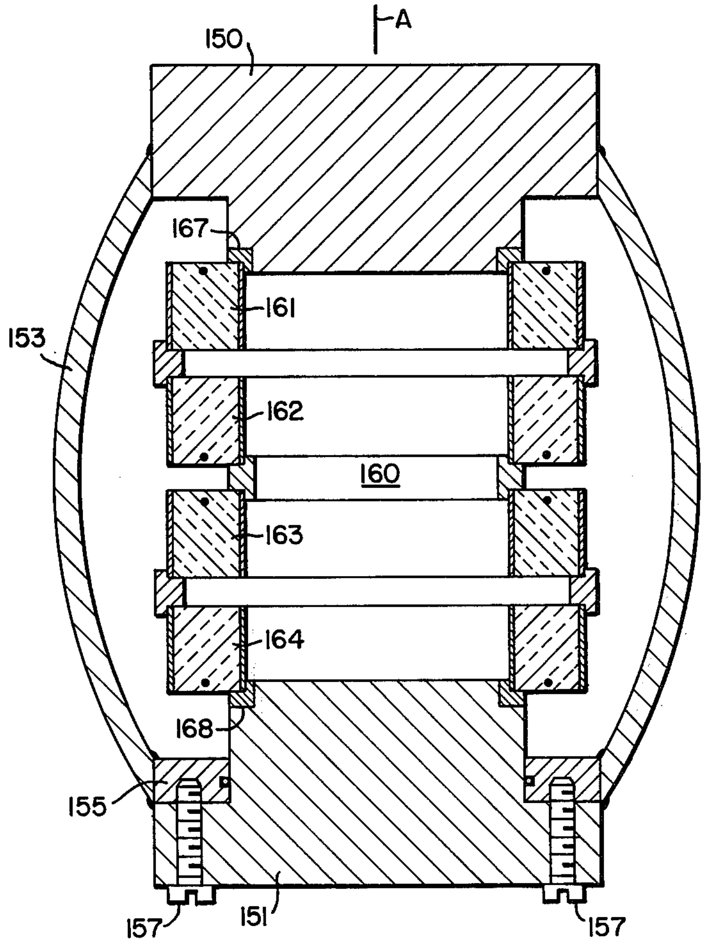

Another type of bender configuration is illustrated in FIG. 7 wherein the transducer includes first and second ends 150 and 151 with a wall 153 extending therebetween. The wall 153 is secured such as by welding to the end 150 and for ease of assembly is secured to a ring 155 at the other end, the ring in turn being affixed to end 151 by means of, for example, bolts 157.

The active motor/generator section 160 includes four piezoelectric elements 161 to 164 in the form of rings supported for shear mode operation between ends 150 and 151. The piezoelectric elements are all operative in a shear mode as previously described and are poled as indicated by the dots. Ends 150 and 151 may be fabricated of aluminum, and accordingly for proper operation of the transducer, the active section 160 is electrically insulated from the ends by means of insulating washer inserts 167 and 168.

The side wall 153 bulges outwardly and as such may be characterized as being convex. During operation, the ends 150 and 151 move toward and away from one another and acoustic radiation (or reception) occurs from both the side wall 153 and ends 150 and 151. Since the side wall 153 has a more extensive surface area, it is the principal radiator and the acoustic energy therefrom is 180° out of phase with the ends. If the side wall is fabricated so as to bulge inwardly, that is with a concave side walled member, the acoustic energy will then be in phase with the ends 150 and 151 during operation.

What we claim is:

1. An electroacoustic transducer comprising:
A. a head mass;
B. a tail mass;
C. piezoelectric type oscillatory material which is active in the shear mode of operation coupled to and supported between said head and tail masses;
D. said oscillatory material being in the form of a plurality of piezoelectric rings each having inner, outer and end planar surfaces;
E. a first support member coupled to said head mass;
F. a second support member coupled to said tail mass;
G. said first and second support members having shoulder portions for respective engagement with a first and second one of said piezoelectric rings; and
H. a third support member common to both said first and second piezoelectric rings.

2. An electro-acoustic transducer comprising:
A. a cylindrical housing;
B. first and second bender discs connected to said housing at opposite ends thereof and defining an interior; and
C. piezoelectric type oscillatory material which is active in the shear mode of operation coupled to and supported between said first and second bender discs, within said interior.

3. An electro-acoustic transducer comprising:
A. first and second end sections spaced apart along a longitudinal axis;
B. an outside wall extending between and coupled to said end sections;
C. piezoelectric type oscillatory material which is active in the shear mode of operation coupled to and supported between, said first and second end sections;
D. said outside wall completely surrounding said longitudinal axis and said oscillatory material, and being curved from said first end section to said second end section.

4. An electroacoustic transducer comprising:
A. a head mass;
B. a tail mass;
C. piezoelectric type oscillatory material which is active in the shear mode of operation coupled to and supported between said head and tail masses;
D. said oscillatory material being in the form of a plurality of piezoelectric rings each having inner, outer and end planar surfaces;
E. at least two of said plurality of piezoelectric rings being adjacent and spaced apart with an end planar surface of one facing an end planar surface of the other;
F. electrode means connected to respective inner and outer surfaces of said plurality of piezoelectric rings;
G. means connecting a first of said two piezoelectric rings to said head mass;
H. means connecting the other of said two piezoelectric rings to said tail mass; and
I. a support member common to both said two piezoelectric rings.

5. An electroacoustic transducer comprising:
A. a head mass;
B. a tail mass;
C. piezoelectric type oscillatory material which is active in the shear mode of operation coupled to and supported between said head and tail masses;
D. said oscillatory material being in the form of a plurality of piezoelectric rings each having inner, outer and end planar surfaces;
E. at least two of said plurality of piezoelectric rings being spaced apart and concentrically arranged with the inner surface of one facing the outer surface of the other;

F. electrode means connected to respective inner and outer surfaces of said plurality of piezoelectric rings;

G. means connecting a first of said two piezoelectric rings to said head mass;

H. means connecting the other of said two piezoelectric rings to said tail mass; and I. a support member common to both said two piezoelectric rings.

* * * * *